United States Patent
Blessing et al.

(10) Patent No.: US 7,597,234 B2
(45) Date of Patent: Oct. 6, 2009

(54) METHOD FOR MOUNTING A FLIP CHIP ON A SUBSTRATE

(75) Inventors: Patrick Blessing, Thalwil (CH); Ruedi Grueter, Buttisholz (CH); Dominik Werne, Oberaegeri (CH)

(73) Assignee: Oerlikon Assembly Equipment AG, Steinhausen, Cham (CH)

( * ) Notice: Subject to any disclaimer, the term of this patent is extended or adjusted under 35 U.S.C. 154(b) by 220 days.

(21) Appl. No.: 11/644,445

(22) Filed: Dec. 22, 2006

(65) Prior Publication Data

US 2007/0145102 A1 Jun. 28, 2007

(30) Foreign Application Priority Data

Dec. 22, 2005 (EP) .................................. 05112853

(51) Int. Cl.
*B23K 31/12* (2006.01)
*H01L 21/00* (2006.01)
(52) U.S. Cl. ............................. 228/105; 228/103; 228/8
(58) Field of Classification Search ................ 228/8, 228/9, 10, 103, 105, 178, 179.1, 180.1, 108.21, 228/180.22
See application file for complete search history.

(56) References Cited

U.S. PATENT DOCUMENTS

| 5,903,662 | A | | 5/1999 | DeCarlo |
| 6,016,013 | A | * | 1/2000 | Baba .......................... 257/778 |
| 6,276,590 | B1 | * | 8/2001 | Nakazato ..................... 228/41 |
| 2003/0046812 | A1 | | 3/2003 | Terada et al. |

FOREIGN PATENT DOCUMENTS

| EP | 1 395 106 | 3/2004 |
| JP | 7-263897 | 10/1995 |

* cited by examiner

*Primary Examiner*—Jessica L Ward
*Assistant Examiner*—Megha Mehta
(74) *Attorney, Agent, or Firm*—Nixon Peabody LLP; David B. Ritchie

(57) ABSTRACT

The invention concerns a method for mounting a semiconductor chip with bumps on one surface onto a substrate location of a substrate, whereby the bumps are brought into contact with corresponding pads on the substrate location. Reference marks are attached to the bondhead that enable measurement of the actual position of the semiconductor chip as well as measurement of the actual position of the substrate location in relation to a system of coordinates defined by the reference marks. Positional displacement of the individual components of the assembly machine caused by thermal influences can be compensated without perpetual calibration procedures having to be carried out.

2 Claims, 3 Drawing Sheets

METHOD FOR MOUNTING A FLIP CHIP ON A SUBSTRATE

PRIORITY CLAIM

Applicants hereby claim foreign priority under 35 U.S.C § 119 from European patent application no. 05112853.6 filed Dec. 22, 2005, the disclosure of which is herein incorporated by reference.

TECHNICAL FIELD

The invention concerns a method for mounting a flip chip on a substrate. A flip chip is a semiconductor chip that has a surface with so-called bumps through which the electrical connections to the substrate are made.

BACKGROUND

Usually, when mounting semiconductor chips on a substrate, the substrate is presented on a horizontally oriented support surface and the semiconductor chips are presented on a wafer table whereby the electrical contact areas of the semiconductor chip point upwards. The semiconductor chip is removed from the wafer table by a bondhead of an assembly machine, a so-called Die Bonder, and placed onto the substrate. This assembly method is known in the trade as epoxy die bonding or softsolder die bonding depending on whether the semiconductor chip is glued to the substrate with epoxy or soldered to the substrate with solder. The flip chip method differs from this assembly method in that the electrical as well as the mechanical connection between the semiconductor chip and the substrate is made through the bumps. So that the semiconductor chip with the bumps can be mounted, it has to be turned (flipped) by 180° after removal from the wafer table, hence the name flip chip.

With the flip chip method, the bumps on the semiconductor chip have to be brought into contact with the electrical connection areas of the substrate, the so-called pads. The demands on the placement accuracy are therefore somewhat greater with the flip chip method than with epoxy die bonding. Today, in order to be able to build such precise assembly machines, a lot of effort is put into the accuracy of the mechanical axes of motion. Such an assembly machine comprises for example a flip device that removes the semiconductor chip from the wafer table and turns it, a pick & place system with a bondhead that removes the flipped semiconductor chip from the flip device and places it on the substrate, and three cameras whereby the first camera makes an image of the semiconductor chip presented on the wafer table, the second camera makes an image of the already turned and picked up semiconductor chip—and therefore flip chip—by the bondhead, i.e., an image of the surface of the semiconductor chip with the bumps, and the third camera makes an image of the substrate with the pads. The images made by the second and third cameras are processed in order to determine the position of the flip chip and the position of the substrate in relation to the axes of motion of the bondhead so that the bondhead can place the flip chip in a positionally accurate manner onto the substrate. Temperature fluctuations cause linear expansion and have the effect that the position of the cameras changes relative to each other and to the axes of motion of the bondhead. In order to minimize the influence of temperature fluctuations on the placement accuracy, the distances between the second and third camera and the mechanical transport system are kept as short as possible. Hence an assembly machine is known for example with which the bondhead with the flip chip is brought into a position above the substrate, then the second and third camera are swung in between the flip chip and the substrate, the bondhead is repositioned based on the images delivered by the second and third camera, the second and third cameras are swung out again and the bondhead lowered. With this assembly method however, maintaining the placement accuracy is achieved at the cost of the throughput.

SUMMARY OF THE INVENTION

An object of the invention is to provide a method for mounting a flip chip that enables high placement accuracy and high throughput.

The invention therefore concerns a method for mounting a semiconductor chip with bumps on one surface onto a substrate location of a substrate whereby the bumps are brought into contact with corresponding pads on the substrate location. Positioning of the semiconductor chip over the substrate location is achieved by means of three axes of motion that correspond to two translatory and one rotary degree of freedom. The semiconductor chip is removed from a wafer table, turned by 180° about an axis parallel to the surface with the bumps and passed over to a bondhead. The bondhead contains a chip gripper that is rotatable on an axis. Parallel to this, the next substrate location is presented. The invention is characterized by the following steps:

A) With a first camera (sometimes referred to as "flipvision"), making an image of the semiconductor chip, whereby the image contains the bumps on the semiconductor chip as well as reference marks placed on the bondhead, and whereby the three axes of motion are in first positions. Determining the position and orientation of the actual position of the semiconductor chip in relation to a system of coordinates defined by the reference marks and calculating a first correction vector $v_1$ that describes the deviation of the actual position of the semiconductor chip from its set position;

B) With a second camera (sometimes referred to as "bondvision"), making a first image, whereby the substrate location is visible in the image, determining the position and orientation of the substrate location in relation to the system of coordinates defined by the reference marks, whereby fictitious positions are used for the positions of the reference marks that they would take up if the three axes of motion had been moved from the first positions by a vector v to second positions, and calculating a second correction vector $v_2$ that describes the deviation of the actual position of the substrate location from its set position;

C) Calculating the positions to be approached by the three axes of motion under consideration of the vector v and the two correction vectors $v_1$ and $v_2$;

D) Moving the three axes of motion into these calculated positions;

E) Making a second image with the second camera whereby the reference marks attached to the bondhead are visible in the image and determining the actual positions of the reference marks;

F) Calculating a third correction vector $v_3$, that describes the deviation of the actual positions of the reference marks from the used fictitious positions of the reference marks assumed in step B on evaluation of the first image made by the second camera;

G) Adapting the vector v to v=v+v₃;
H) If at least one component of the third correction vector $v_3$ is greater than a predetermined limit value, moving at least the axis of motion corresponding to this component to a new, corrected position; and
I) Depositing the semiconductor chip onto the substrate location.

The reference marks are placed on the bondhead. This is to be understood in such a way that the reference marks are either located on the (non-rotating) housing of the bondhead or on the chip gripper that is rotatable on the axis.

Steps A, B, C, D and I are always carried out. Steps E, F, G and H are carried out for mounting the first semiconductor chip that is mounted on starting production or after interrupting production in order to ensure that this semiconductor chip is placed at the correct location. Vector v describes the distance between the optical axes of the two cameras and the rotational position of the two cameras to one another. Vector v is updated each time by steps E, F, G and H. Vector v changes relatively slowly as the result of thermal influences. Steps E, F, G and H can be carried out on mounting every semiconductor chip by which very high placement accuracy is achieved. However, steps E, F, G and H may also be carried out sporadically, e.g. for each nth semiconductor chip or at predetermined time intervals. If necessary, steps E, F, G and H can be carried out several times in succession until all components of the third correction vector $v_3$ are less than the specified limit value.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments. The figures are not to scale. In the drawings.

DESCRIPTION OF EXAMPLE EMBODIMENTS

Figure 1:
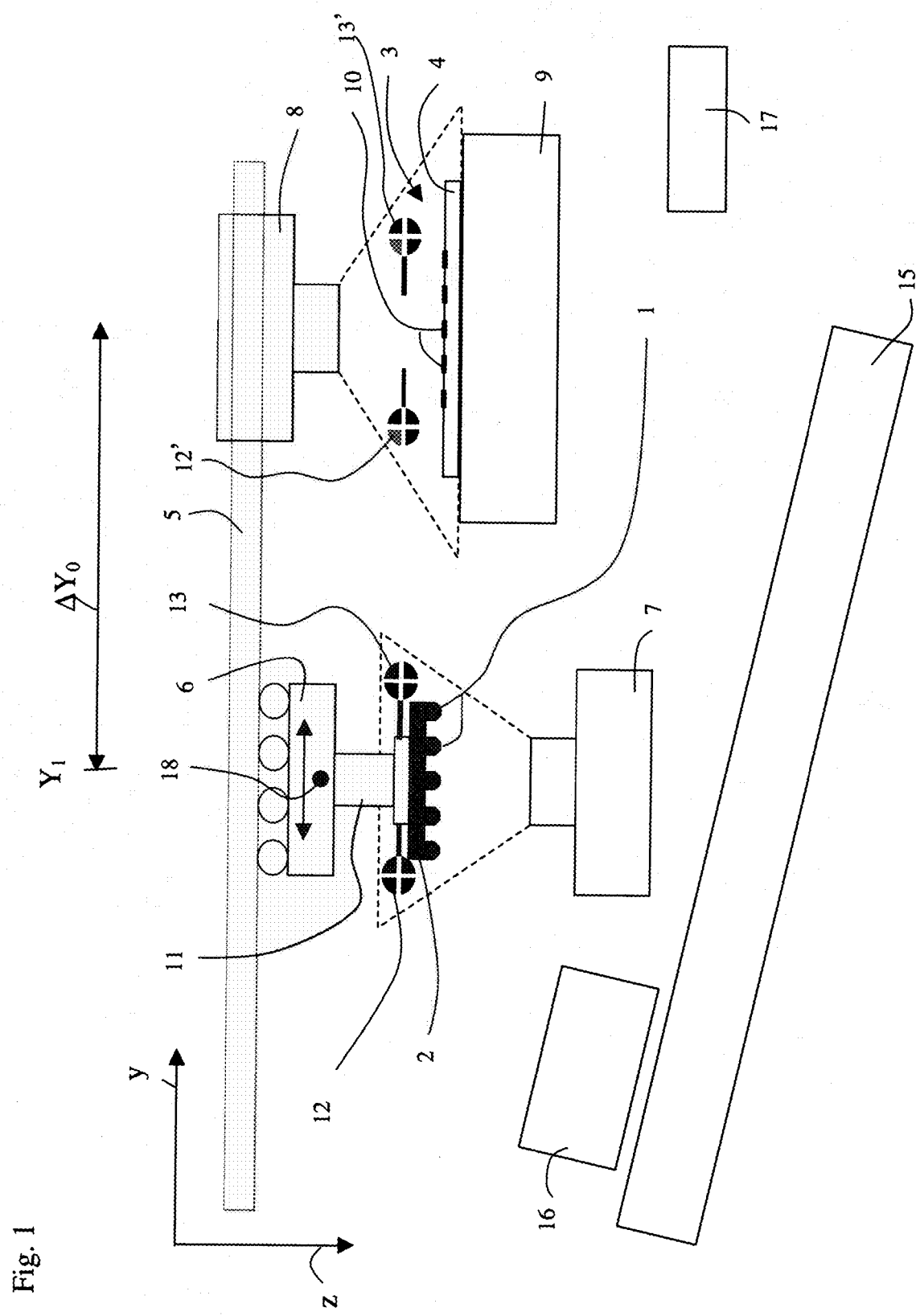
FIG. 1 illustrates components of an assembly machine for mounting semiconductor chips with bumps as a flip chip onto a substrate.

FIG. 1 illustrates an example embodiment based on a schematic presentation of certain components of an assembly machine for mounting a semiconductor chip 2 with bumps 1 (flip chip), onto a substrate location 3 of a substrate 4. The coordinates of a Cartesian system of coordinates are designated x, y and z whereby the x coordinate runs perpendicular to the plane of drawing. The assembly machine comprises a so-called pick & place system with a bondhead 6 that moves back and forth along an axis 5 running in y direction, and two cameras 7 and 8. The position of the bondhead 6 on the axis 5 is controlled by a generally known position measurement and control circuit that is not explained in more detail here. The substrates 4 are transported by a transport system in x direction to a bonding station 9 where each time the bondhead 6 places a semiconductor chip 2 onto a substrate location 3 that has electrical contact surfaces, so-called pads 10 assigned to the bumps 1. The bondhead 6 contains a chip gripper 11 that can be moved up and down in z direction and rotated on its longitudinal axis, i.e., here on the z-axis. In addition, the bondhead 6 has three reference marks 12, 13 and 14 arranged at intervals to one another (in FIG. 1 only the reference marks 12 and 13 are visible), the function of which is explained in detail in the following. With the embodiment shown in FIG. 1 the reference marks 12, 13 and 14 are arranged on the chip gripper 11 that forms part of the bondhead 6. Alternatively, the reference marks 12, 13 and 14 may be arranged on the housing of the bondhead 6. The semiconductor chips 2 are presented on a wafer table 15. The assembly machine further comprises a flip device 16 as well as a control and processing unit 17 that controls the assembly machine. With the sectional view shown in FIG. 1 five bumps 1 are visible arranged adjacent to one another in a row that correspond to five pads 10 lying adjacent to one another in a row on the substrate location 3.

In order that the bumps 1 on the semiconductor chip 2 can be placed positionally accurate onto the pads 3 on the substrate location so that the bumps 1 and the pads 10 come to lie on one another with the necessary accuracy, three degrees of freedom have to be brought into agreement, namely the translatory position, characterised by two coordinates, and the orientation (rotational position), characterised by an angle of rotation, of the semiconductor chip 2 in relation to the position and orientation (rotational position) of the substrate location 3. Each degree of freedom is assigned to at least one axis of motion. Each axis of motion is assigned to a drive so that the corresponding movement can be carried out. The three degrees of freedom can therefore be realised by means of the x-axis of the transport system for the substrate 4, the y-axis of the bondhead 6 and the angle of rotation θ of the chip gripper 11. However, it is of advantage to equip the assembly machine with a further axis of motion 18 that enables movement of the bondhead 6 in x direction whereby this axis of motion 18 can only carry out movements in the sub-millimetre range but significantly quicker than the transport system for the substrate 4.

In the ideal situation, i.e. when the semiconductor chip 2 picked up by the bondhead 6 is in its set position and when the substrate location 3 is also in its set position, in order to deposit the semiconductor chip 2 onto the substrate location 3 the bondhead 6 only has to be moved by a predetermined distance $\Delta Y_0$ in the y direction from the location where the position of the semiconductor chip 2 is determined by means of the first camera 7.

Mounting the semiconductor chip 2 on the substrate 4 is achieved according to the following steps whereby in this example it is assumed that the axis of motion 18 is used (and not the transport system for transporting the substrate 4 in the x direction) in order to position the semiconductor chip 2 correctly above the substrate location 3 in the x direction.

With this example therefore, the axis of motion 18, the y-axis of the bondhead 6 and the angle of rotation θ of the chip gripper 11 present the three axes of motion that are assigned to the three degrees of freedom. In the following, their positions are designated X, Y and θ.

In a first phase, the semiconductor chip 2 is removed from the wafer table 15, turned by the flip device 16 and passed over to the bondhead 6. To carry out these steps, a construction of the assembly machine is particularly suitable with which the semiconductor chip 2 is removed from the wafer table 15 by the flip device 16, turned and then passed over to the bondhead 6 at a predetermined location. The first phase then takes place for example as follows:

Moving the wafer table 15 so that the next semiconductor chip 2 is ready for picking up by the flip device 16.

Making an image of the presented semiconductor chip 2 in order to check whether the semiconductor chip 2 is at the correct location and, if bad semiconductor chips are marked, check whether the semiconductor chip 2 is a good or bad semiconductor chip.

If the semiconductor chip 2 is a good semiconductor chip, detaching the semiconductor chip 2 from the wafer table 15 and picking up the semiconductor chip 2 by the flip device 16.

With the flip device 16, flipping the semiconductor chip 2, i.e. rotating the semiconductor chip by 180° about an axis parallel to the surface with the bumps, Turning the chip gripper 11 to a predetermined rotational position designated in the following as angle of rotation $\theta_1$.

Moving the axis of motion 18 to a predetermined position designated in the following as $X_1$.

Passing over the semiconductor chip 2 from the flip device 16 to the bondhead 6.

Presenting the substrate location 3 onto which the semiconductor chip 2 is to be mounted.

Wetting the bumps 1 of the semiconductor chip 2 with flux. This step can be omitted when alternatively the pads 10 of the substrate 4 have flux or so-called tapes are used.

Positioning the bondhead 6 in a predetermined y position so that the two reference marks 12, 13 and 14 and the semiconductor chip 2 are located in the field of view of the first camera 7. This y position is designated as $Y_1$.

The three axes of motion therefore have the positions $X_1$, $Y_1$ and $\theta_1$ Now, in a second phase, the following steps take place in an example embodiment.

A) With the first camera 7, making an image of the semiconductor chip 2 whereby the image contains the bumps 1 of the semiconductor chip 2 as well as the reference marks 12, 13 and 14 attached to the bondhead 6, determining the actual position of the semiconductor chip 2 in relation to a system of coordinates defined by the three reference marks 12, 13 and 14 and calculating a first correction vector $v_1$ that describes the deviation of the actual position of the semiconductor chip 2 from its set position. Determining the actual position of the semiconductor chip 2 is done either by means of evaluating the position of the bumps 1 or the position of reference marks, so-called fiducials, attached to the semiconductor chip 2.

The deviation of the actual position of the semiconductor chip 2 from its set position is characterised by three quantities $\Delta x_1$, $\Delta y_1$ and $\Delta \theta_1$ whereby $\Delta x_1$ and $\Delta y_1$ designate the shifting of a reference point P of the semiconductor chip 2 in x direction or y direction and $\Delta \theta_1$ the rotation of the semiconductor chip 2 about the reference point P. The correction vector $v_1$ is therefore given by $v_1 = (\Delta x_1, \Delta y_1, \Delta \theta_1)$. In the example, the reference point P is the center point of the set position of the semiconductor chip 2.

Figure 2:
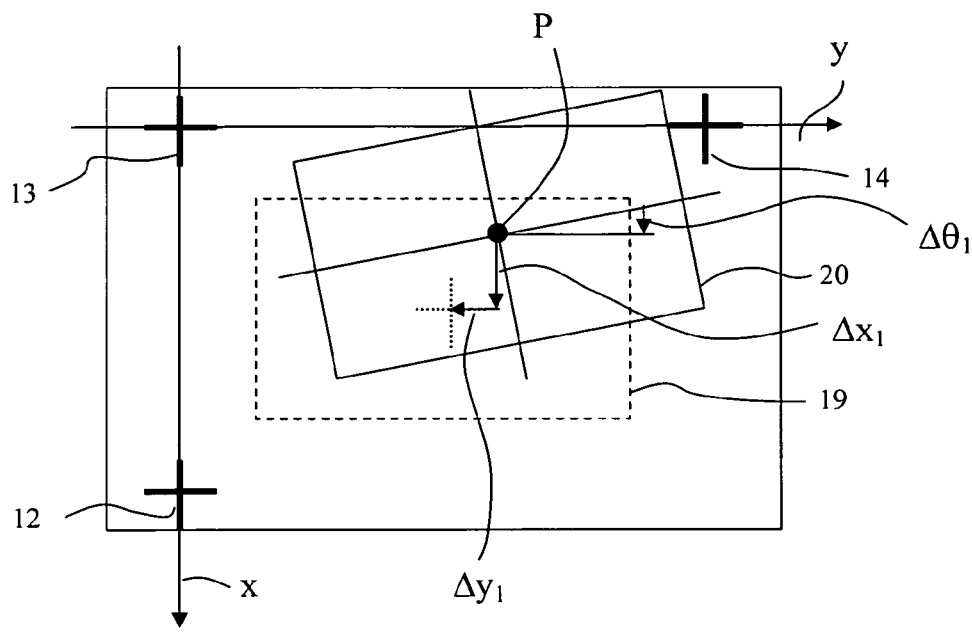
FIGS. 2, 3 illustrate geometrical presentations of mathematical relations.

FIG. 2 illustrates this situation. The reference marks 12, 13 and 14 define a local system of coordinates with two Cartesian coordinate axes, i.e., coordinate axes x and y lying perpendicular to one another. FIG. 2 illustrates the set position presented with a dashed rectangle 19 and the actual position of the semiconductor chip 2 presented with a continuous rectangle 20 as well as the three reference marks 12, 13 and 14. The correction vector $v_1$ indicates the value by which the axes of motion have to be moved so that the actual position of the semiconductor chip 2 coincides with its set position. The axes of the rectangle 19 run preferably parallel to the coordinate axes x and y and its centre is located for example in the centre of a rectangle formed by the three reference marks 12, 13 and 14.

B) With the second camera 8, making an image of the substrate 4, determining the actual position of the substrate location in relation to the system of coordinates defined by the three reference marks 12, 13 and 14 whereby for the position of the three reference marks 12, 13 and 14 their position $R_0$ is used that they take up when the axes of motion are in position $(X_1+\Delta x, Y_1+\Delta Y_0+\Delta y, \theta_1+\Delta\theta)$, and calculating a second correction vector $v_2$ that describes the deviation of the actual position of the substrate location from its set position. (For this reason, the reference marks that are actually not present in FIG. 1 are nevertheless presented in grey as reference marks 12', 13'). The significance of the values $\Delta x$, $\Delta y$ and $\Delta\theta$ is explained further below. Determining the actual position, i.e. the translatory position and the orientation of the substrate location 3 is done either by evaluating the position of its pads 10 or by evaluating the position of reference marks arranged on the substrate 4.

The deviation of the actual position of the substrate location 3 from its set position is characterised by three quantities $\Delta x_2$, $\Delta y_2$ and $\Delta\theta_2$, whereby $\Delta x_2$ and $\Delta y_2$ designate the shifting of a reference point S of the substrate location 3 in x direction or y direction and $\Delta\theta_2$ the rotation of the substrate location 3 about the reference point S. The second correction vector $v_2$ is therefore given by $v_2 = (\Delta x_2, \Delta y_2, \Delta\theta_2)$. In the example, the reference point S is the centre point of the set position of the substrate location 3.

Figure 3:
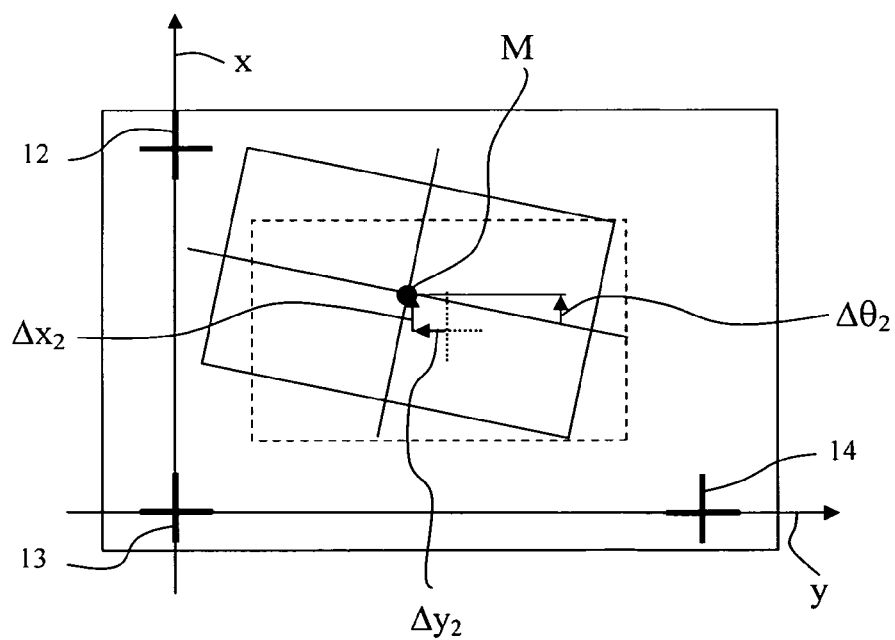

FIG. 3 illustrates this situation. FIG. 3 shows the set position of the substrate location 3 as a broken rectangle 21 and the actual position as a continuous rectangle 22 as well as the position of the three reference marks 12, 13 and 14 calculated on the assumption that the axes of motion are in position $(X_1+\Delta x, Y_1+\Delta Y_0+\Delta y, \theta_1+\Delta\theta)$ (the reference marks 12, 13 and 14 are not contained in the image made by the camera 8). Corresponding to the set position of the semiconductor chip 2, the set position of the substrate location 3 is characterised in that the centre point M of the substrate location 3 lies in the centre of a rectangle defined by the three reference marks 12, 13 and 14 and that the pads 10 of the substrate location 3 are arranged parallel to the x or y axis. The correction vector $v_2$ indicates the values by which the axes of motion have to be moved so that the actual position of the substrate location 3 coincides with its set position.

The values $\Delta x$, $\Delta y$ and $\Delta\theta$ represent a vector v. The first semiconductor chip 2 of a production batch can be mounted on the assumption that $\Delta x=0$, $\Delta y=0$ and $\Delta\theta=0$, as any error caused by this is eliminated during the course of the method.

C) Calculating the positions to be approached by the three axes of motion under consideration of the two correction vectors $v_1$ and $v_2$, as well as the vector v as $(X_1+\Delta x_1+\Delta x_2+\Delta x, Y_1+\Delta Y_0+\Delta y_1+\Delta y_2+\Delta y, \theta_1+\Delta\theta_1+\Delta\theta_2+\Delta\theta)$, i.e. as $X_1+\Delta x_1+\Delta x_2+\Delta x$ for the position of the bondhead 6 along the x axis, in the example for the axis of motion 18, $Y_1+\Delta Y_0+\Delta y_1+\Delta y_2+\Delta y$ for the position of the bondhead 6 along the y axis, and $\theta_1+\Delta\theta_1+\Delta\theta_2+\Delta\theta$ for the angle of rotation of the chip gripper 11.

D) Moving the three axes of motion to these calculated positions.

E) With the second camera 8, making an image whereby the image now contains the reference marks 12, 13 and 14 attached to the bondhead 6, and determining the actual position $R_1$ of the three reference marks 12, 13 and 14.

F) Calculating a third correction vector $v_3 = (\Delta x_3, \Delta y_3, \Delta\theta_3)$ that describes the deviation of the actual position $R_1$ of the reference marks 12, 13 and 14 from their position $R_0$ used for determining the second correction vector $v_2$.

G) If at least one component of the third correction vector $v_3$ is greater than a specified limit value, moving the corresponding axis of motion to a new position corrected by the corresponding component of the correction vector $v_3$ or moving all three axes of motion to new positions corrected by the third correction vector $v_3$. In the latter case therefore to the positions $(X_1+\Delta x_1+\Delta x_2+\Delta x_3+\Delta x, Y_1+\Delta Y_0+\Delta y_1+\Delta y_2+\Delta y_3+\Delta y, \theta_1+\Delta\theta_1+\Delta\theta_2+\Delta\theta_3+\Delta\theta)$.

H) Adapting the vector v to $v=v+v_3$.

I) Depositing the semiconductor chip 2 onto the substrate location 3.

The correction vectors $v_1$ and $v_2$ characterise possible positioning errors of the semiconductor chip 2 or the substrate location 3. The vector v characterises the total accumulated positional displacement of the individual components of the assembly machine as a result of thermal influences. The third correction vector $v_3$ characterises the changes occurring as a result of thermal influences. On the one hand, the method described therefore guarantees that the first semiconductor chip of a production batch is already mounted correctly and, on the other hand, that thermal positional displacements are continuously compensated without the axes of motion having to be perpetually recalibrated.

The described order of the method steps can, under certain circumstances, deviate from the given order as certain steps can be carried out in parallel or in the reverse order.

Steps A, B, C, D and I are always carried out. Steps E, F, G and H are carried out whenever the vector v is not yet known with the required accuracy or when it can be expected that the vector v could have changed. If necessary, steps E, F, G and H can be carried out several times in succession until all components of the third correction vector $v_3$ are less than a specified limit value.

The reference marks 12, 13 and 14 are preferably placed on a plate made of glass in the form of structured markings in chrome. Glass is transparent so that the reference marks 12, 13 and 14 can be seen by both cameras 7 and 8. Preferably, a glass is chosen the coefficient of thermal expansion of which is as low as possible. The dimensions of the plate are selected greater than the dimensions of the largest semiconductor chip to be mounted and the reference marks 12, 13 and 14 placed close to the edge so that the reference marks 12, 13 and 14 are visible to both cameras 7 and 8 independently of the size of the semiconductor chip.

Figure 4:
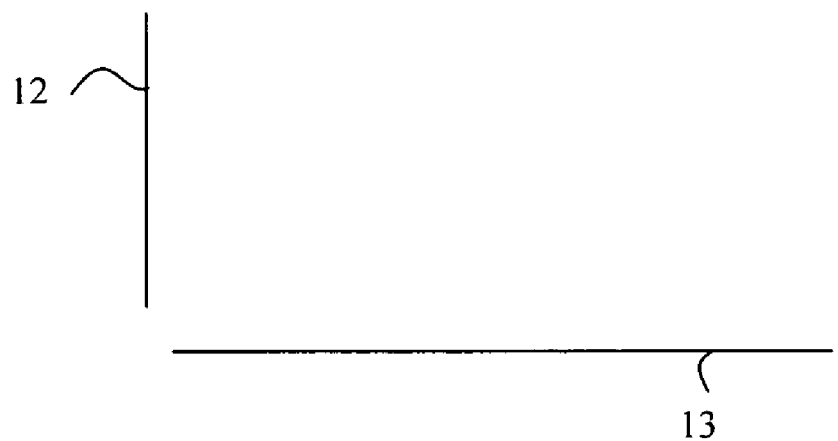
FIGS. 4, 5 illustrate examples of reference marks.
Figure 5:
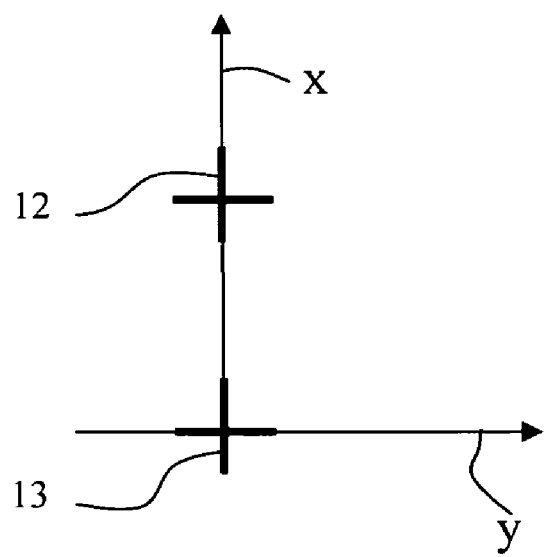

The function of the reference marks 12, 13 and 14 lies in the definition of a local system of coordinates in relation to which the set position of the semiconductor chip as well as the set position of the substrate location are defined. As reference marks, in the sense of the invention, other solutions are also valid that fulfill this function. Instead of the three reference marks 12, 13 and 14, for example two reference marks 12 and 13 can be foreseen that are formed by two lines aligned orthogonal to one another as is shown in FIG. 4. The reference mark 12 defines the position of the x-axis and the reference mark 13 defines the position of the y-axis of the local Cartesian system of coordinates. A further solution is shown in FIG. 5. Here, two reference marks 12 and 13 define the position of the x-axis of the local Cartesian system of coordinates. The y-axis of the local Cartesian system of coordinates is defined so that it runs perpendicular to the x-axis and straight through the reference mark 13.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A method for mounting a semiconductor chip having a surface with bumps onto a substrate location of a substrate wherein the bumps are brought into contact with corresponding pads on the substrate location and the positioning of the semiconductor chip over the substrate location is accomplished by means of a drive system including at least three axes of motion, the method comprising:
   a) picking the semiconductor chip from a wafer table;
   b) turning the semiconductor chip by 180° about an axis parallel to the surface with the bumps;
   c) passing the semiconductor chip over to a bondhead;
   d) presenting the substrate location;
   e1) making a first image of the semiconductor chip with a first camera having a first optical axis when the at least three axes of motion of the drive system are in a first position, wherein the first image shows the bumps of the semiconductor chip as well as reference marks attached to the bondhead,
   e2) determining from the first image the position and orientation of the actual position of the semiconductor chip in relation to a system of coordinates defined by the reference marks attached to the bondhead and, based thereon,
   e3) calculating a first correction vector $v_1$ that describes the deviation of the actual position of the semiconductor chip from its set position;
   f1) making a second image with a second camera having a second optical axis not aligned with the first optical axis wherein the substrate location in its actual position is visible in the second image and wherein the reference marks attached to the bondhead are not visible,
   f2) determining the position and orientation of the substrate location in relation to the system of coordinates defined by the reference marks attached to the bondhead, wherein fictitious positions are used for the positions of the reference marks that they would take up if the three axes of motion had been moved from the first position by a vector v to a second position, and, based thereon,
   f3) calculating a second correction vector $v_2$ that describes the deviation of the actual position of the substrate location from its set position;
   g) calculating the final position to be approached by the at least three axes of motion of the drive system based upon the vector v and the two correction vectors $v_1$ and $v_2$;
   h) moving the at least three axes of motion of the drive system to the calculated final position; and
   i) depositing the semiconductor chip onto the substrate location.

2. The method according to claim 1, wherein after step h the following steps are carried out:
   h1) making a third image with the second camera wherein the reference marks are visible in the third image, and determining the actual positions of said reference marks;
   h2) calculating a third correction vector $v_3$ that describes the deviation of the actual positions of the reference marks from the used fictitious positions of the reference marks assumed in steps f1, f2 and f3 on evaluation of the second image made by the second camera;
   h3) updating the vector v to $v=v+v_3$; and
   h4) if at least one component of the third correction vector $v_3$ is greater than a specified limit value, moving at least the axis of motion corresponding to this component to a new, corrected position.

* * * * *